United States Patent [19]

Seidel et al.

[11] Patent Number: 4,774,764
[45] Date of Patent: Oct. 4, 1988

[54] METHOD FOR FASTENING CENTERING STRIPS

[75] Inventors: Peter Seidel, Groebenzell; Leo Pelzl, Holzkirchen; Karl Zell, Niederpoecking, all of Fed. Rep. of Germany

[73] Assignee: Siemens Aktiengesellschaft, Berlin and Munich, Fed. Rep. of Germany

[21] Appl. No.: 928,838

[22] Filed: Nov. 10, 1986

[30] Foreign Application Priority Data

Nov. 29, 1985 [DE] Fed. Rep. of Germany ....... 3542288

[51] Int. Cl.4 ...................... H01R 43/01; H01R 43/20
[52] U.S. Cl. ........................................ 29/884; 29/865; 29/866; 29/876; 439/409; 439/741
[58] Field of Search ................. 29/865, 866, 876, 884; 439/409, 410, 741

[56] References Cited

U.S. PATENT DOCUMENTS 3,348,191 10/1967 Kinkaid ........................... 439/741 X
3,845,456 10/1974 Michaels ........................ 439/741 X
4,536,049 8/1985 Wilmes ............................... 439/409

Primary Examiner—Howard N. Goldberg
Assistant Examiner—Taylor J. Ross
Attorney, Agent, or Firm—Hill, Van Santen, Steadman & Simpson

[57] ABSTRACT

Centering strips, pluggable onto the contact blades of a wiring backpanel for receiving cable plugs, are provided with fastening disks in the region of openings in the floor of the centering strips through which the contact blades project into the centering strip, the fastening disk likewise including openings for plugging the contact blades therethrough. After the centering strip has been plugged, the fastening disks are located such that their inner edges of their openings cut into the contact blades and their outer edges cut into the floor of the centering strip. A positive fixing between contact blade, fastening disk and centering strip is thereby achieved.

16 Claims, 4 Drawing Sheets

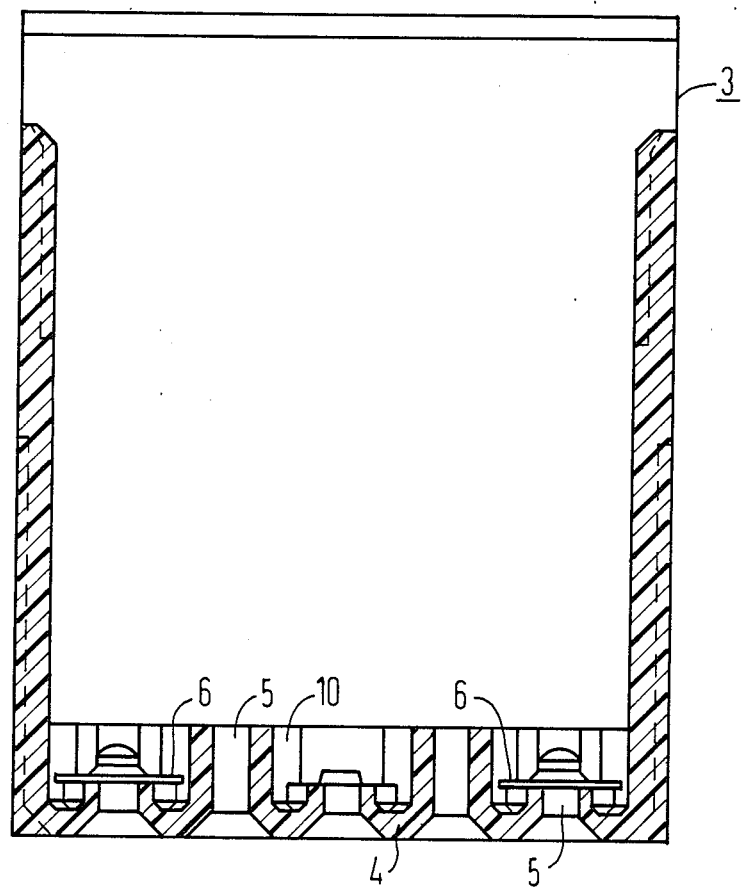

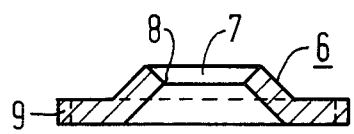
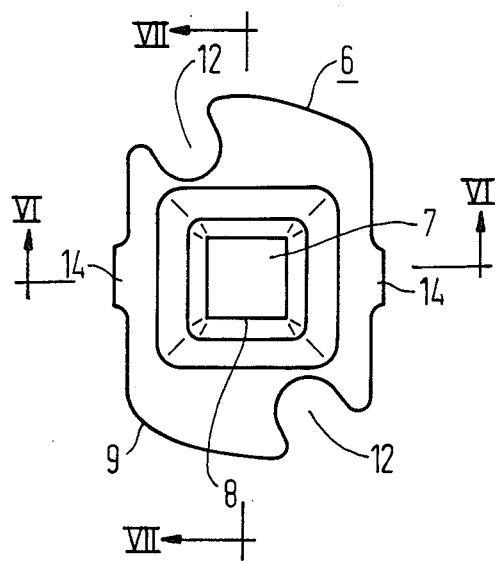
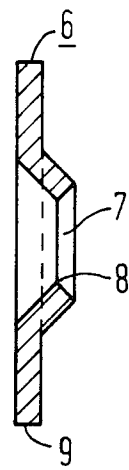

METHOD FOR FASTENING CENTERING STRIPS

BACKGROUND OF THE INVENTION

1. Field of the Invention

The present invention relates to a method for fastening centering strips serving for receiving cable plugs or modules, the centering strips being pluggable to the contact blades of a backpanel printed circuitboard of an assembly rack, whereby the free ends of the contact blades project through clearances in the floor of the centering strip and into the centering strip.

2. Description of the Prior Art

It is known in the art to provide such centering strips with flanges at their ends and to secure the same to the assembly rack by way of the flanges. When, for example, the centering strips serve for receiving one or more cable plugs, then considerable pressure or tension forces occur when plugging or unplugging the cable plugs, the forces potentially leading a destruction of the centering strip or the individual blades. The problem of destruction particularly occurs when cable plugs must be plugged or unplugged in the center portion of the centering strip.

SUMMARY OF THE INVENTION

The object of the present invention is to provide a method for fastening centering strips to a wiring backpanel which prevents damage to the centering strip or to the blades from occurring when plugging or unplugging cable plugs.

The above object is achieved, according to the present invention, in that a plurality of fastening disks are provided with clearances for plugging the contact blades, the fastening disk being provided in holes in the floor of the centering strip. The disk can be turned such that portions of the inner edges defining the clearances cut into the contact blade and portions of the outer edges of the disk cut into the floor of the centering strip.

The method of the present invention enables a firm connection of the centering strip to the contact blades over the full length of the centering strip. When turning the fastening disks, the edges of the clearances cut into the contact blades. Simultaneously, however, an intersection of the outer contour of a fastening disk with the centering strip also occurs. A positive fixing between the contact blades, the fastening disks and the centering strip therefore occurs. The pressure or, respectively, tensile forces occurring during plugging or unplugging of cable plugs are thereby divided onto a plurality of fastening points. As a result thereof, a yielding and deformation of the centering strip and of the blades when plugging and unplugging assemblies is prevented, whereby damage to the centering strip and blades is prevented.

A centering strip particularly suited for the implementation of the method of the invention is characterized in that essentially rectangular depressions for receiving the fastening disks are provided in the region of the clearances at the inside of the floor of the centering strip, and in that the fastening disks are removably and captively held by way of stampings carried out at respective long edges of the depressions after the insertion of the fastening disks.

Given a centering strip constructed in this manner, the equipping of the centering strip with the fastening disks can occur from above in a simple manner. Given this centering strip, the stampings can likewise be produced in just as simple a manner, the stampings retaining the fastening disks in a mobile and captive fashion in the floor of the centering strip. Since the fastening disks are arranged at the inside of the floor of the centering strip, they are accessible for tools for turning the fastening disks after the centering strip comprising the fastening disk has been plugged onto the contact blades.

An advantageous fastening disk for the centering strip of the present invention is characterized in that the outer dimensions are essentially rectangular, whereby the longer outer edges are fashioned substantially straight and comprise projections lying in the middle thereof, whereas the shorter outer edges are fashioned in the shape of an arc, in that a funnel-shaped clearance or opening is provided in the center of the fastening disk, the cross-section of this passage corresponding to the cross-section of the contact blade, or, respectively, being minimally greater than the cross-section of the contact blade, and in the recesses for the engagement of a turning tool are arranged in two corners of a disk which lie diagonally opposite one another.

As a consequence of the funnel-shaped design of the opening, the plug-on operation of the centering strip comprising the fastening disk onto the contact blades is facilitated. At the same time, sharp inner edges are thereby created which facilitate the cutting of the inside edges into the contact blade. Due to the formation of the shorter, outer edges in the form of an arc, the cutting of the outer edges into the floor of the centering strip when turning the fastening disk is facilitated.

BRIEF DESCRIPTION OF THE DRAWINGS

Other objects, features and advantages of the invention, its organization, construction and operation will be best understood from the following detailed description, taken in conjunction with the accompanying drawings, on which:

FIG. 4 is a sectional view through the centering strip;

FIG. 5 is a plan view of a fastening disk;

FIG. 6 is a sectional view taken substantially along the line VI—VI of FIG. 5; and FIG. 7 is a longitudinal sectional view taken along the line VII—VII of FIG. 5.

DESCRIPTION OF THE PREFERRED EMBODIMENTS

Figure 1:
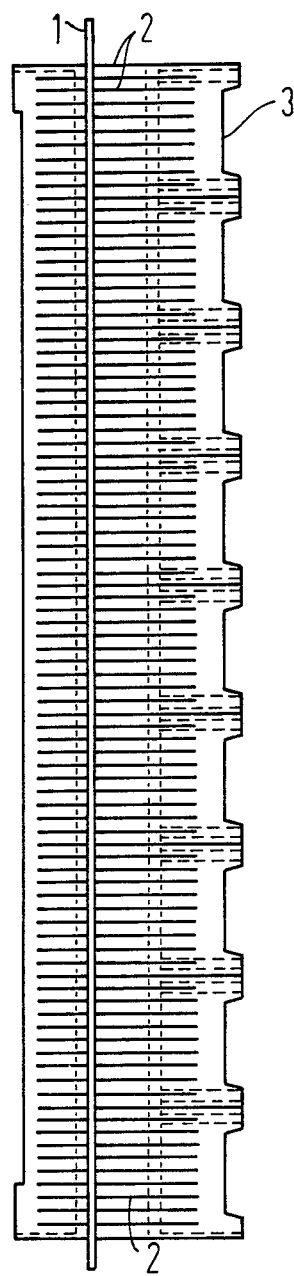
FIG. 1 is a basic elevation view of a centering strip in combination with a wiring backpanel.

The basic structure of an assembly rack comprising wiring backpanels for receiving assemblies or cable plugs is presumed to be known to those skilled in the art and shall therefore not be described in greater detail in this context. FIG. 1 shows only the fundamental arrangement of the centering strip 3 of the present invention in combination with a wiring backpanel 1. The wiring backpanel 1 is provided with a plurality of contact blades 2 onto which the centering strip 3 can be plugged. With the assistance of the method of the present invention, the centering strip 3 can be connected to the contact blades 2 in any desired spacing from the backpanel 1.

Figure 3:
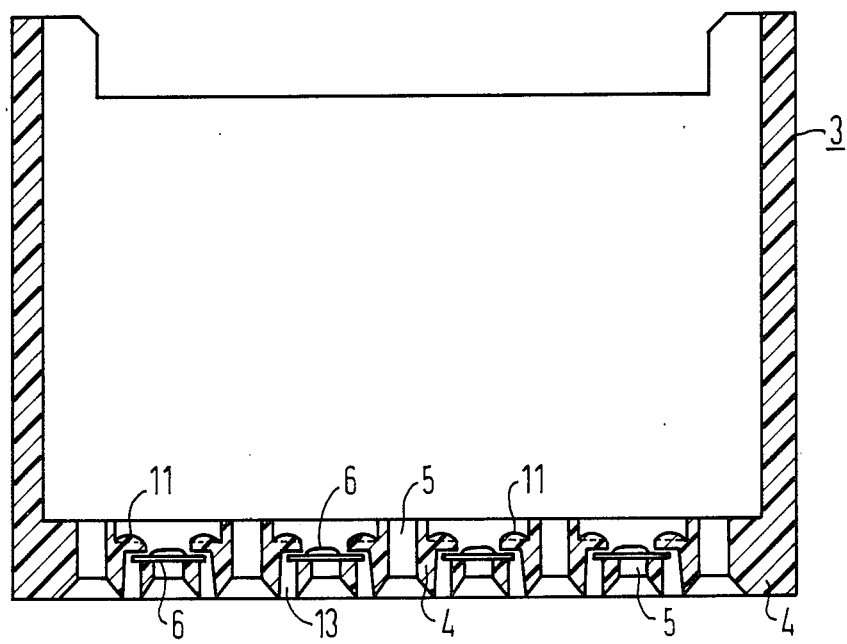
FIG. 3 is a partial section through the centering strip.
Figure 2:
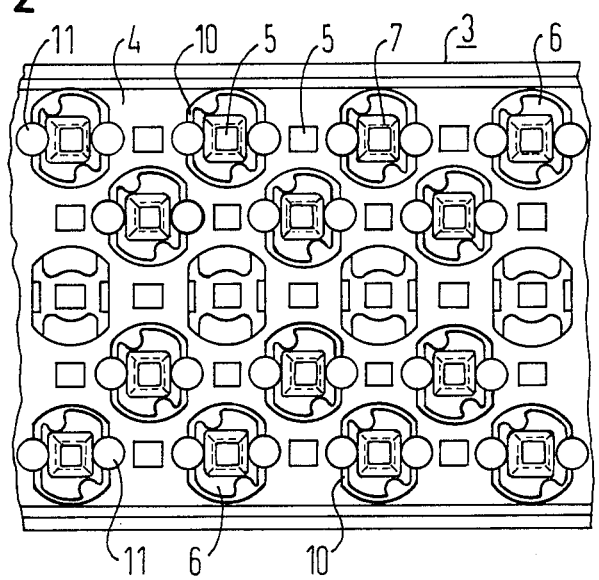
FIG. 2 is a partial plan view of the floor of the centering strip.

The method of the invention, as well as the centering strip for implementation of the method, shall be set forth below with reference to FIGS. 2–4. The centering strip 3 is a rectangular housing open at one side and comprising a floor 4. The floor 4 of the centering strip comprises openings 5 therethrough which receive the free ends of the contact blades as they project into the centering strip. The spacing of the openings 5 in the floor 4 of the centering strip corresponds to the spacing of the contact blades 2.

Given the illustrated centering strip 3, a depression 10 is provided for receiving a fastening disk 6 in the region of each second opening 5. The dimensions of the depressions 10 are selected such that the fastening disks 6 exhibit play after insertion so that they can be moved back and forth with a certain tolerance. This horizontal play is necessary in order to enable easy plugging of the centering strip equipped with the fastening disks onto the contact blades.

After the insertion of the fastening disks 6 into the depressions 10 of the floor 4 of the centering strip, the fastening disks 6 are held captive and movable in the depressions 10 by way of stampings 11. The stampings 11 can occur, for example, by way of ultrasonics. In order to also achieve a vertical mobility of the fastening disks 6 in addition of the horizontal mobility, the fastening disk 6 is held at a defined height during the stamping process with a tool which acts on a fastening disk 6 through the slots 13. Given the centering strip of the present invention, therefore, the fastening disk 6 are embedded in the floor 4 of the centering strip in a captive and mobile fashion.

Even though depression is provided in the region of each second opening 5 in the centering strip 3 of the invention, all of the depressions 10 need not be equipped with fastening disks, dependent on application. Dependent on the application, for example, it can be adequate to equip only the two outer rows wit fastening disks 6. Referring to FIGS. 5–7, a fastening disk of the present invention is illustrated. The outer dimensions of the fastening disks 6 are essentially rectangular. The longer outer edges are fashioned straight and each comprise projections 14 in the center. The projections 14 are located under the stampings 11 in the built-in condition of the fastening disk. The shorter outer edges of the fastening disk 6 are fashioned in the shape of an arc. The opening 7 through the fastening disk 6 is fashioned in the form of a funnel to facilitate the plugging process onto the contact blades 2. The dimensions of the opening 7 essentially correspond to the cross section of the contact blades 2. A further advantage of the opening 7 constructed as a funnel is that a sharp inner edge 8 arises. Recesses 12 are provided for receiving pegs of a turning tool for turning the fastening disks 6, being provided at two diagonally opposite corners of the fastening disk 6.

After the centering strip 3 equipped with the fastening disks 6 is plugged onto the contact blades, the fastening disks 6 are turned by way of the turning tool when the centering strip is located in the desired position. When a rotational sense in the clockwise direction is assumed, then it can be seen from FIG. 5 that all four sharp inner edges 8 cut into the material of the contact blade 2, whereas the upper right and lower left corners of the fastening disk 6 cut into the floor material of the centering strip 3. This cutting into the floor material of the centering strip is promoted by the circular arc-like construction of the shorter outer edges. After the turning of the fastening disk, therefore, a positive fixing between the contact blades, the fastening disks and the centering strip arises. The tensile and pressure forces are therefore divided onto a plurality of contact blades. A sag of the centering strip 3 toward the wiring backpanel 1 or, respectively, away from the backpanel 1 is thereby prevented. The stability of the contact blades 2 is also enhanced since, as a result of being fixed in the floor 4 of the centering strip, the free ends can be mechanically shortened.

Although we have described our invention by reference to a particular illustrative embodiment thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. A method of fastening a centering strip onto contact blades which extend from a panel, the centering strip comprising, for each blade, an opening through the floor thereof for receiving the contact blade therethrough and a fastening disk including an opening aligned with the respective opening in the floor of the centering strip for receiving the free end of the respective contact blade therethrough, and each fastening disk comprising an inner edge defining its opening and an outer peripheral edge, comprising the steps of:
   plugging the centering strip and the fastening disks onto the free ends of the contact blades; and
   rotating the fastening disks to cut the inner edges of the fastning disks into the respective contact blades and cut the portions of the outer edges of the fastening disks into the floor of the centering strip.

2. A method of making a centering strip which includes a floor having openings therethrough for receiving respective contact blades extending from a wiring panel, comprising the steps of:
   producing a fastening disk for each contact blade by forming a sharp-edge hole through a disk body and forming a non-circular peripheral edge on the body including recesses for receiving a tool; and
   rotatably mounting each disk with its sharp edged hole aligned with a respective floor opening for receiving a respective contact blade therethrough, whereby rotation of a disk causes the sharp edges of a hole to cut into the respective contact blade and portions of the outer edge to cut into the floor material.

3. A centering strip structure for receiving the free ends of contact blades which extend from a panel comprising:
   a centering strip comprising sidewalls defining an open side and a floor connected to said sidewalls opposite said open side;
   a plurality of first openings through said floor for receiving a respective contact blade therethrough;
   a plurality of fastening members; and
   a plurality of mounting means each mounting a respective fastening member for rotation at a respective one of said first openings and each including a second opening aligned with respective first opening for receiving the respective contact blade therethrough and defined by a first edge, each of said fastening members including a peripheral edge,
   each of said fastening members being rotatable after receipt of the respective contact blade therethrough to cause said first edge to cut into the contact blade and cause at least a portion of said peripheral edge to cut into said floor.

4. The centering strip structure of claim 3, wherein each of said fastening members comprises:
   a generally flat body including said peripheral edge; and
   a funnel-shaped recess in said body, having said second opening therein, for guiding the respective contact blade.

5. The centering strip structure of claim 4, wherein said generally flat body further comprises:
   a pair of notches in said peripheral edge for receiving a turning tool.

6. The centering strip structure of claim 3, wherein each of said fastening members comprises:
   a rectangular body, said peripheral edge including a pair of long sides and a pair of short sides;
   a funnel-shaped recess in said rectangular body, having said second portion therethrough, for guiding the respective contact blade; and
   a pair of notches in diametrically opposite corners of said rectangular body for receiving a turning tool.

7. The centering strip structure of claim 6, wherein:
   said short sides are arcuate; and
   said long sides are generally straight.

8. The centering strip structure of claim 3, where each of said mounting means comprises:
   a well in said floor including a support surface for supporting a fastening member; and
   portions of said floor extending over a fastening member to sandwich the fastening member between said support surface and said portions.

9. A method of making a centering strip structure for receiving contact blades which extend from a panel, comprising the steps of:
   forming a plurality of fastening members including forming a funnel in a generally flat body and forming a sharp-edge first hole in the funnel;
   forming a plurality of second holes in the floor of a centering strip and forming a respective well in the floor about each of the second holes;
   placing the fastening members into the wells with the first and second holes aligned; and
   securing the fastening members for rotation in the wells.

10. The method of claim 9, wherein the step of securing is further defined as:
    supporting the fastening members at a predetermined depth in the wells; and
    folding portions of the walls of the wells over respective edges of the fastening members.

11. The method of claim 10, wherein the step of folding is further defined as:
    stamping the portions of the walls to fold the same over.

12. The method of claim 10, wherein the step of folding is further defined as:
    ultrasonically displacing the portions of the walls of the wells over the respective edges of the fastening members.

13. A method of making a centering strip structure for receiving contact blades which extend from a panel, comprising the steps of:
    stamping out a plurality of flat bodies to form fastening members from a sheet of metal including pressing a funnel in each flat body and punching a sharp-edge first hole in the funnel;
    molding a centering strip of plastic material to include a plurality of second holes in the floor of the centering strip and contemporaneously molding a respective well in the floor about each of the second holes;
    placing the metal fastening members into the wells with the first and second holes aligned; and
    securing the fastening members for rotation in the wells.

14. The method of claim 13, wherein the step of securing is further defined as:
    supporting the metal fastening members at a predetermined depth in the wells; and
    folding portions of the plastic material of the walls of the wells over respective edges of the fastening members.

15. The method of claim 14, wherein the step of folding is further defined as:
    stamping the portions of the walls of the wells to fold the same over.

16. The method of claim 14, wherein the step of folding is further defined as:
    ultrasonically displacing the portions of the walls of the wells over the respective edges of the fastening members.

* * * * *